Figure 1:
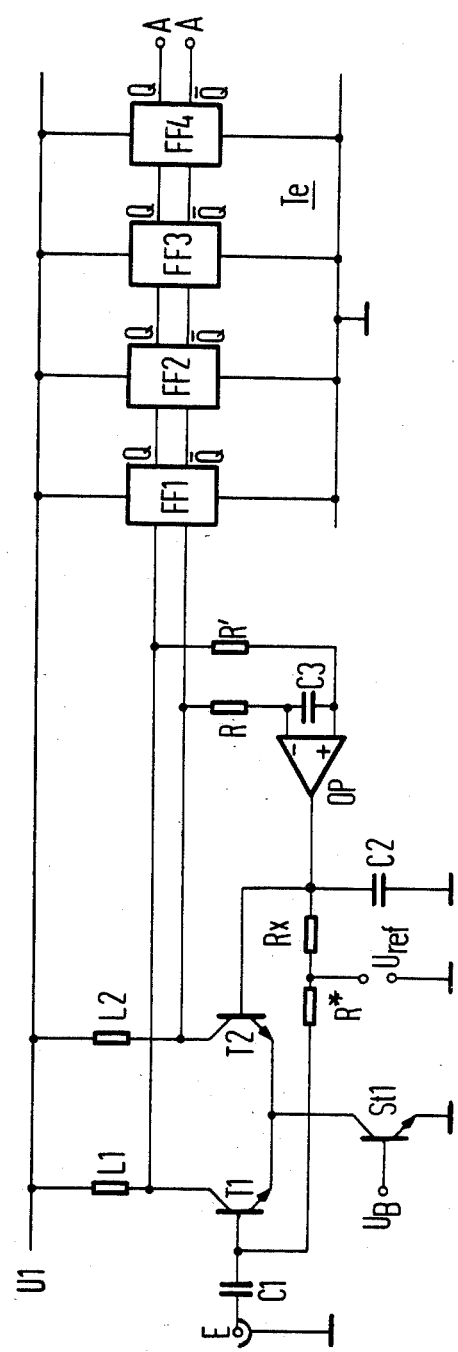

United States Patent [19]

Kriedt et al.

[11] Patent Number: 4,577,336
[45] Date of Patent: Mar. 18, 1986

[54] INTEGRABLE FREQUENCY DIVIDER CIRCUIT HAVING A FEEDBACK CONTROLLED DIFFERENTIAL AMPLIFIER AS ITS PREAMPLIFIER CIRCUIT

[75] Inventors: Hans Kriedt, Munich; Josef Fenk, Eching-Ottenburg, both of Fed. Rep. of Germany

[73] Assignee: Siemens Aktiengesellschaft, Berlin and Munich, Fed. Rep. of Germany

[21] Appl. No.: 736,401

[22] Filed: May 20, 1985

Related U.S. Application Data

[63] Continuation of Ser. No. 435,416, Oct. 20, 1982.

[30] Foreign Application Priority Data

Oct. 21, 1981 [DE] Fed. Rep. of Germany ....... 3141790

[51] Int. Cl.$^4$ .................... H03K 21/02; H03K 21/40; H03K 23/58; H03F 1/34
[52] U.S. Cl. .................................. 377/111; 377/120; 307/543; 307/556; 330/85; 330/259; 330/260
[58] Field of Search ........................ 307/268, 543, 556; 328/162, 164; 330/85, 259, 260; 377/58, 60, 68, 111, 118-120

[56] References Cited

U.S. PATENT DOCUMENTS

| | | | |
|---|---|---|---|
| 3,432,763 | 3/1969 | Ingman | 330/85 X |
| 3,988,689 | 10/1976 | Ochi et al. | 330/85 X |
| 4,309,625 | 1/1982 | Takahashi | 377/120 X |
| 4,315,165 | 2/1982 | Shimizu et al. | 377/120 |

FOREIGN PATENT DOCUMENTS

| | | | |
|---|---|---|---|
| 2518847 | 11/1975 | Fed. Rep. of Germany | 377/111 |
| 0004769 | 1/1977 | Japan | 377/111 |

Primary Examiner—Larry N. Anagnos
Attorney, Agent, or Firm—Herbert L. Lerner; Laurence A. Greenberg

[57] ABSTRACT

Integrable frequency divider circuit, including a preamplifier in the form of a differential amplifier having a signal input for receiving signals to be processed, a reference input and two outputs, a frequency divider having divider stages including a first divider stage, each being in the form of identical series-connected flip-flop cells, the first divider stage having two inputs each being connected to a respective one of the two outputs of the differential amplifier for receiving the signals to be processed, an operational amplifier having an output directly connected to the reference input of the differential amplifier and having two inputs, two resistors each being connected between a respective one of the inputs of the operational amplifier and a respective one of the outputs of the differential amplifier, a capacitor connected between the inputs of the operational amplifier, and another capacitor connected between the output of the operational amplifier and reference potential.

8 Claims, 2 Drawing Figures

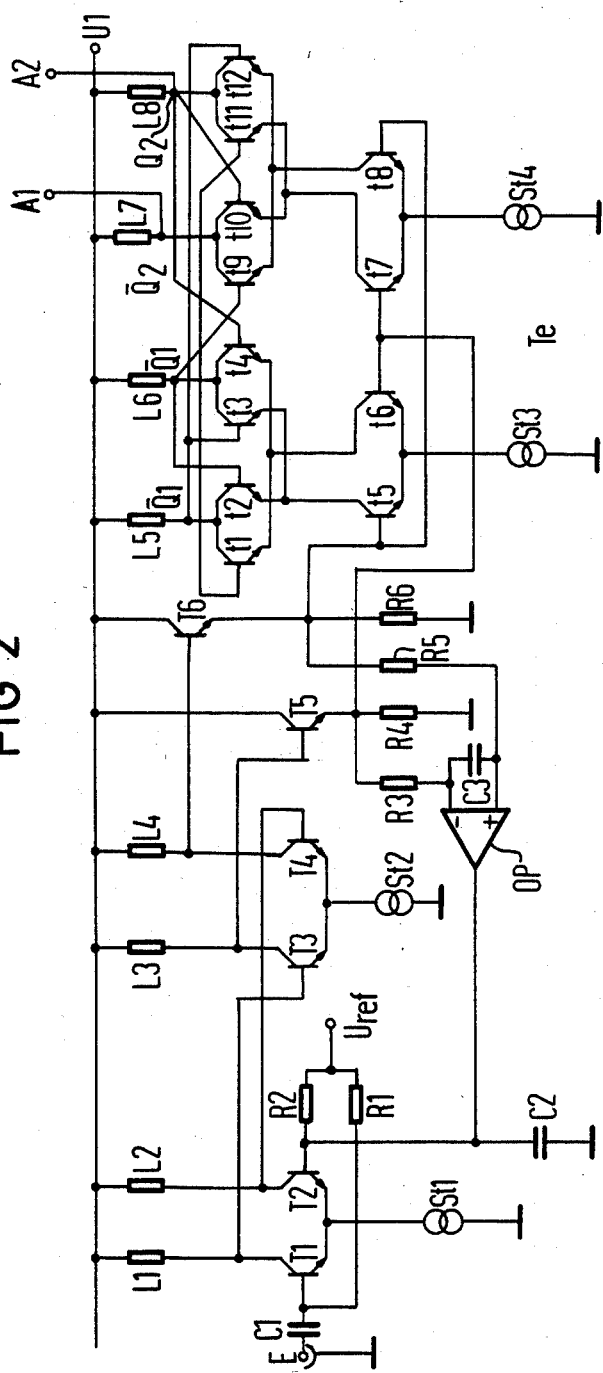

INTEGRABLE FREQUENCY DIVIDER CIRCUIT HAVING A FEEDBACK CONTROLLED DIFFERENTIAL AMPLIFIER AS ITS PREAMPLIFIER CIRCUIT

This application is a continuation, of application Ser. No. 435,416, filed Oct. 20, 1982.

The invention relates to an integrable frequency divider circuit, in which the input signal to be processed is fed through a preamplifier to signal inputs to be addressed of a first divider stage of a frequency divider having a number of series-connected identical flip-flop cells.

At high frequencies in the range of 1 GHz and higher, a problem which arises is that the maximum divider frequency (i.e. the frequency obtained at the output of the first divider stage) of such a frequency divider can only be achieved if a minimum d-c voltage offset is provided at the inputs of the frequency divider. In order to correct this shortcoming and to improve the input sensitivity of the frequency divider, a preamplifier with more than 20 dB gain can be used. Experience shows, however, that if a normally constructed amplifier is used as the preamplifier, minimal offset voltages at the amplifier input are then transmitted in an amplified state to the input of the divider. This leads to a situation wherein the frequency which can be taken off at the output of the first divider stage and optionally at the output of the second divider stage as well, varies considerably (for instance in the case of the first divider stage, up to several hundred MHz).

It is accordingly an object of the invention to provide an integrable frequency divider circuit, which overcomes the hereinafore-mentioned disadvantages of the heretofore-known devices of this general type.

With the foregoing and other objects in view there is provided, in accordance with the invention, an integrable frequency divider circuit, comprising a preamplifier in the form of a differential amplifier which includes a first and a second transistor having a signal input for receiving signals to be processed, a reference input and two controlling outputs, a frequency divider having divider stages including a first divider stage, each being in the form of identical series-connected flip-flop cells, the first divider stage having two inputs to be addressed, each being connected to a respective one of the two controlling outputs of the differential amplifier for receiving the signals to be processed, an operational amplifier having an output directly connected to the reference input of the differential amplifier and having two inputs, two resistors each being connected between a respective one of the inputs of the operational amplifier and a respective one of the controlling outputs of the differential amplifier, a capacitor connected between the inputs of the operational amplifier, and another capacitor connected between the output of the operational amplifier and ground reference potential.

In a further embodiment of the invention, the differential amplifier may be replaced by a cascade of several differential amplifiers.

In accordance with another feature of the invention, there is provided a further capacitor connected in series with the signal input of the differential amplifier for feeding the signals to be processed to the differential amplifier.

In accordance with a further feature of the invention, there is provided at least one first further resistor connected between the signal input and reference input of the differential amplifier.

In accordance with an added feature of the invention, there is provided a series circuit which includes aforesaid first further resistor and a second further resistor, the latter being connected between the output of the operational amplifier, the two further resistors having a divider tap disposed therebetween forming a reference input carrying the reference potential for addressing the reference input of the differential amplifier. This is the case in the embodiment examples shown in the drawing.

In the preferred first embodiment of the invention, the driving input of the frequency divider circuit is connected through a capacitor to the signal input of the first differential amplifier and furthermore, through the first and second further resistors, connected in series with each other, to the base of the second transistor of the differential amplifier. If, instead of a single differential amplifier, in a second embodiment a cascade of several series-connected differential amplifiers is used, the previous and the following statements apply for the first differential amplifier of the cascade. The outputs of the differential amplifier, or the last differential amplifier of the cascade, each serve for controlling one transistor operated as an emitter follower circuit, where the emitters of these two transistors are each connected to one of the two inputs of the operational amplifier, while the direct connection from the output of the differential amplifier to the two inputs of the operational amplifier is omitted. In addition, the outputs of the two transistors operated in the emitter follower circuits are each connected to one of the two inputs of the first divider stage of the frequency divider. The last-mentioned features as well as the use of a cascade of differential amplifiers are found in the second embodiment. Therefore, in accordance with an additional feature of the invention, there is provided another differential amplifier having inputs connected to the first-mentioned differential amplifier for control of these circuit parts and for addressing the operational amplifier and the frequency divider.

In accordance with a concomitant feature of the invention, there are provided two emitter follower transistors being operated as an emitter follower circuit, and two additional pairs of resistors, and two additional transistors each of the additional transistors being connected at their base to a respective one of the outputs of the differential amplifier or output of the other differential amplifier and each of the emitter follower transistors having an emitter being connected through each of the first pair of the additional pairs of resistors to a respective one of the inputs of the operational amplifier, a respective one of the inputs of the operational amplifier and through each one of the second pair of resistors to a respective one of the inputs of the first divider stage for addressing the respective one of the inputs of the first divider stage.

Other features which are considered as characteristic for the invention are set forth in the appended claims.

Although the invention is illustrated and described herein as embodied in an integrable frequency divider circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1 and 2 are schematic circuit diagrams of first and second respective embodiments of the invention.

Referring now to the figures of the drawing and first pacrticularly to the embodiment of the invention shown in FIG. 1 thereof, it is seen that a driving signal input E addressed by the frequency to be divided is connected through a capacitor C1 as a signal input to the base terminal of a first npn-transistor T1 of a differential amplifier T1, T2, the emitter of which is connected to the emitter of an identical transistor T2. The emitters of both of the transistors T1 and T2 are connected to ground potential through a current source St1, while their collectors are each connected through a respective load resistor L1 and L2 to a first supply potential $+U1$ of the circuit. The reference input of the differential amplifier T1, T2, represented by the base of the transistor T2, is connected through a voltage divider, formed of two resistors Rx, R*, to the signal input of the differential amplifier T1, T2, represented by the base of the first transistor T1. A reference potential $U_{ref}$, referenced to ground, is connected to the divider tap. In the case of the first embodiment of FIG. 1, the current source St1 is in the form of a further npn-transistor, the emitter of which is connected directly to the ground potential, the base of which is connected to a third supply potential $U_B$; and the collector of which is connected to the emitters of the two npn-transistors T1 and T2 of the differential amplifier. The current source St1 could also be in the form of a current mirror, for example.

Constructing the transistors T1, T2 of the differential amplifier as npn-tansistors is advantageous as compared to using pnp-bipolar transistors of higher switching speed, as is also possible. However, the circuit can also be constructed using MOS-field effect transistors, especially switching transistors of the n-channel type. In general, the choice of the transistors forming the differential and the operational amplifiers will depend on the transistors used in flip-flop cells FF1, FF2, . . . of a frequency divider Te in order to achieve a monolithic composition of the circuit at the lowest possible cost. In both figures, the npn-bipolar transistors are used exclusively, the detailed structure of the flip-flop cells being dispensed with in FIG. 1.

The current output electrodes, i.e. the collectors of the two transistors T1 and T2 of the differential amplifier are each connected through a respective resistor R and R' to one of two inputs of an operational amplifier OP constructed in the usual manner. The non-inverting input of the operational amplifier OP is assigned to the transistor T1 and the inverting input is assigned to the transistor T2. The inputs are furthermore connected together, according to the definition of the invention, by a capacitor C3. Each of the of transistor T1 and T2 collectors are furthermore connected to a respective one of two inputs of the first divider stage FF1 of the frequency divider Te.

In the case of the embodiment according to FIG. 1, the frequency divider Te has four stages FF1 to FF4. The signals obtained due to the division can be taken off at the outputs of the stages. The divider stages FF1, FF2, . . . which are represented by one flip-flop cell each, may be constructed in any known way suitable for a binary counter or frequency divider, for instance, as JK flip-flop cells.

On one hand, it is important for the invention for the output of the operational amplifier OP to be connected to the base terminal of the transistor T2 (or if MOS-transistors are used, to the gate of the transistor T2), while, on the other hand, there is a connection between the control electrode, i.e., the base terminal, of ground transistor T2 and the reference potential, through a capacitor C2. In addition, the base of transistor T2 of the differential amplifier T1, T2 is connected, as mentioned above, through a second further resistor Rx to the reference potential $U_{ref}$ as well as through a first further further resistor to the base of the signal input transistor T1 of the differential amplifier T1, T2.

If in the embodiment of a divider circuit, according to the invention shown in FIG. 1, a cascade of several series-connected differential amplifiers of the same type as the differential amplifier T1, T2 is used instead of a single differential amplifier T1, T2; the series-connected resistors Rx, R* and the reference potential $U_{ref}$ as well as the output of the operational amplifier OP are connected to the transistors T1, T2 of the first differential amplifier; and the inputs of the operational amplifier are connected to the collectors of the last differential amplifier of the cascade, which at the same time serve for controlling the first divider stage FF1 of the frequency divider Te.

In the embodiment shown in FIG. 2, the preamplifier is formed of first and second differential amplifiers T1, T2 and T3, T4, respectively, which are connected together in the manner indicated. The resistors Rx and R* in FIG. 1 have been designated a first pair of additional resistors, namely R2, R1, respectively, in FIG. 2. The second differential amplifier stage T3, T4 is likewise formed of npn-transistors. The emitters of the transistors T3, T4 are connected through a second common current source St2 to ground the reference potential, while the collectors thereof, forming the signal output of the preamplifier, are each additionally connected through a respective load resistor L3, L4 to the first supply potential U1. The third transistor T3 is controlled by the signal input transistor T1, and the fourth transistor T4 is controlled by the reference transistor T2 of the first differential stage T1, T2. The collector of the transistor T3 controls the base of a fifth transistors T5 operated in an emitter follower circuit, i.e. a common collector circuit, and the collector of the fourth transistor T4 controls a sixth transistor T6 likewise operated in an emitter follower circuit, i.e. a common collector circuit. Both of the transistors T5, T6 are of the npn-type. If the differential amplifier is formed of only the differential stage T1, T2, then the base of the transistor T5 is controlled by the input transistor T1 and the base of the transistor T6 is directly controlled by the reference transistor T2 of the first differential amplifier stage T1, T2.

The emitters of the fifth and sixth transistors T5 and T6 are each connected on one hand to a respective signal input, namely the respective base of transistors t5 and t6 of the first divider stage, as well as through a second pair of additional resistors, namely respective resistor R4 and R6 to the ground potential of the circuit. Finally, the emitters of the transistors T5 and T6, which operate as emitter followers due to the circuit described, are connected each to one of the inputs of the operational amplifier OP through the first pair of additional resistors R3, R5. Therefore, in the case of the example shown, the npn-transistor T5, controlled by the transistor T1 or T3, respectively, is connected through a resistor R3 to the inverting input, and the transistor T6, controlled by the transistor T2 or T4, respectively, is connected to the non-inverting or direct input of the operational amplifier OP.

The divider Te is likewise formed of npn-transistors. In the case of the illustrated embodiment example, only one divider stage is shown.

In the divider, the input addressed by the transistor T5 is represented by the base terminals of two transistors t6, t7. Together with a further transistor t5 or t8, respectively, each of the transistors t6, t7 form differential amplifier t5, t6 and t7, t8. Associated with the differential amplifier stages t5, t6 is a constant-current source St3, and associated with the differential amplifier t7, t8 is a constant-current source St4. Each differential amplifier stages t5, t6 and t7, t8 serves for controlling two further transistor pairs t1, t2 and t3, t4 and t9, t10 and t11, t12, respectively. Contrary to the transistors of the differential amplifiers, the transistors of the further transistor pairs are connected to the first supply potential U1 and are each combined exclusively through their collectors, and through a respective load resistor L5 to L8, respectively. The base terminals of the individual transistors t1 to t4 are connected to the base terminals of the transistors t9 to t12 in the manner shown in FIG. 2, which is known per se. In addition, these transistors pairs are controlled at the emitters of their transistors in the manner which is also seen in FIG. 2. Since the embodiment of the divider stage FF1 as shown is within the state of the art, a further explanation of the details thereof can be dispensed with. The outputs of the divider stage in FIG. 2 or of the divider Te in FIG. 1 are designated A1, A2 or A, respectively.

With respect to the effect of the measures taken according to the invention, the following can be said.

The circuit combination formed by the resistors R, R' or R4, R6 and the capacitor C3 form a low pass filter. The high-frequency signal is separated by the low pass, while the d-c voltage component addresses the operational amplifier OP. The push-pull current output of the operational amplifier OP compensates the offset at the inputs and therefore the transistors of the first divider stage FF1 of the divider Te, to a certain degree specifically with a residual deviation remaining in accordance with the control gain. The compensation is provided at the base of the transistors in the differential amplifier T1,T2, through the load resistors R* and Rx (FIG. 1) or R1, R2 (FIG. 2). The capacitor C2 which connects the output of the operational amplifier OP to the reference potential (ground) serves the following purpose in the invention:

(1) Blanking out the reference, so that the HF preamplifier stage T1, T2 or stages T1, T2, T3, T4, respectively, is given the maximum amplifier effect; and (2) Action as a low-pass stage in the control loop of the working point negative feedback to suppress control oscillations.

The foregoing is a description corresponding to German Application P No. 31 41 790.6, dated Oct. 21, 1981, the International priority of which is being claimed for the instant application, and which is hereby made part of this application. Any discrepancies between the foregoing specification and the aforementioned corresponding German application are to be resolved in favor of the latter.

We claim:

1. Integrable frequency divider circuit, comprising a preamplifier in the form of a differential amplifier having at least one stage and having a signal input for receiving signals to be processed, a reference input and two outputs, a frequency divider having divider stages including a first divider stage, each being in the form of identical series-connected flip-flop cells, said first divider stage having two inputs each being connected to a respective one of said two outputs of said differential amplifier for receiving the signals to be processed, an operational amplifier having an output directly connected to said reference input of said differential amplifier and having two inputs, two resistors each being connected between a respective one of said inputs of said operational amplifier and a respective one of said outputs of said differential amplifier, and a capacitor connected between said inputs of said operational amplifier.

2. Frequency divider circuit according to claim 1, including another capacitor connected between the output of the operational amplifier and ground potential.

3. Frequency divider circuit according to claim 2, including a series circuit of two further resistors being connected between said signal input and the output of said operational amplifier, said two further resistors having a divider tap disposed therebetween carrying the reference potential for addressing said reference input of said differential amplifier.

4. Frequency divider circuit according to claim 1, including at least one further resistor connected between said signal input and reference input of said differential amplifier.

5. Frequency divider circuit according to claim 1, further comprising a second differential amplifier having inputs connected to said differential amplifier for control and for addressing said operational amplifier and said frequency divider.

6. Frequency divider circuit according to claim 5, including two emitter follower transistors having their inputs connected to said outputs of said differential amplifier and being operated in an emitter follower circuit, and a first pair of additional resistors, each of said emitter follower transistors being connected at its base to a respective output of said second differential amplifier and each of said emitter follower transistors having an emitter being connected through one of said additional resistors to a respective one of said inputs of said operational amplifier, for addressing a respective one of said inputs of said operational amplifiers and for addressing a respective one of said inputs of said first divider stage.

7. Frequency divider circuit according to claim 1, including two emitter follower transistors having their inputs connected to said outputs of said differential amplifier and being operated in an emitter follower circuit, a first pair of additional resistors and two additional transistors forming a second differential amplifier stage, each of said emitter follower transistors being connected at its base to a respective one of said outputs of said differential amplifier and each of said emitter follower transistors having an emitter being connected through one of said additional resistors to a respective one of said inputs of said operational amplifier, for addressing a respective one of said inputs of said operational amplifier and for addressing a respective one of said inputs of said first divider stage.

8. A frequency divider circuit according to claim 1 including a further capacitor connected to said signal input of said differential amplifier for feeding the signals to be processed to said differential amplifier.

* * * * *